(12) United States Patent
Chikara et al.

(10) Patent No.: US 12,408,268 B2
(45) Date of Patent: Sep. 2, 2025

(54) ORGANIC INSULATOR AND WIRING BOARD

(71) Applicant: KYOCERA Corporation, Kyoto (JP)

(72) Inventors: Chie Chikara, Kyotanabe (JP); Tadashi Nagasawa, Kirishima (JP); Satoshi Yoshiura, Kyotanabe (JP); Satoshi Kajita, Ikoma (JP); Kouji Fujikawa, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 212 days.

(21) Appl. No.: 17/927,479

(22) PCT Filed: May 24, 2021

(86) PCT No.: PCT/JP2021/019496
§ 371 (c)(1),
(2) Date: Nov. 23, 2022

(87) PCT Pub. No.: WO2021/241469
PCT Pub. Date: Dec. 2, 2021

(65) Prior Publication Data
US 2023/0209708 A1    Jun. 29, 2023

(30) Foreign Application Priority Data

May 27, 2020   (JP) .................................. 2020-092426

(51) Int. Cl.
*H05K 1/03*    (2006.01)
*H05K 1/02*    (2006.01)

(52) U.S. Cl.
CPC ......... *H05K 1/0373* (2013.01); *H05K 1/0256* (2013.01); *H05K 2201/0158* (2013.01)

(58) Field of Classification Search
CPC ...... H05K 1/03; H05K 1/0373; H05K 1/0256; H05K 2201/0158
USPC ...................................................... 174/137 B
See application file for complete search history.

(56) References Cited

U.S. PATENT DOCUMENTS

2020/0077514 A1    3/2020   Nagasawa et al.

FOREIGN PATENT DOCUMENTS

| JP | 2010-100843 A | 5/2010 |
|---|---|---|
| JP | 2018-035257 A | 3/2018 |
| JP | 2019011430 A | 1/2019 |
| JP | 2021-004347 A | 1/2021 |
| WO | 2019/142570 A1 | 7/2019 |

*Primary Examiner* — Tremesha W Burns
(74) *Attorney, Agent, or Firm* — Volpe Koenig

(57) ABSTRACT

An organic insulator is produced by cured resin product containing a cyclic olefin copolymer as a main component and has a cumulative luminescence amount measured by chemiluminescence measurement method of $4 \times 10^5$ cpm or less. The glass transition temperature of the cured product is from 134° C. to 140° C. The cumulative luminescence amount is from $8.2 \times 10^5$ cpm to $3.2 \times 10^5$ cpm. A wiring board includes an insulation layer and an electrical conductor layer disposed on a surface of the insulation layer, and the insulation layer is the organic insulator described above.

4 Claims, 1 Drawing Sheet

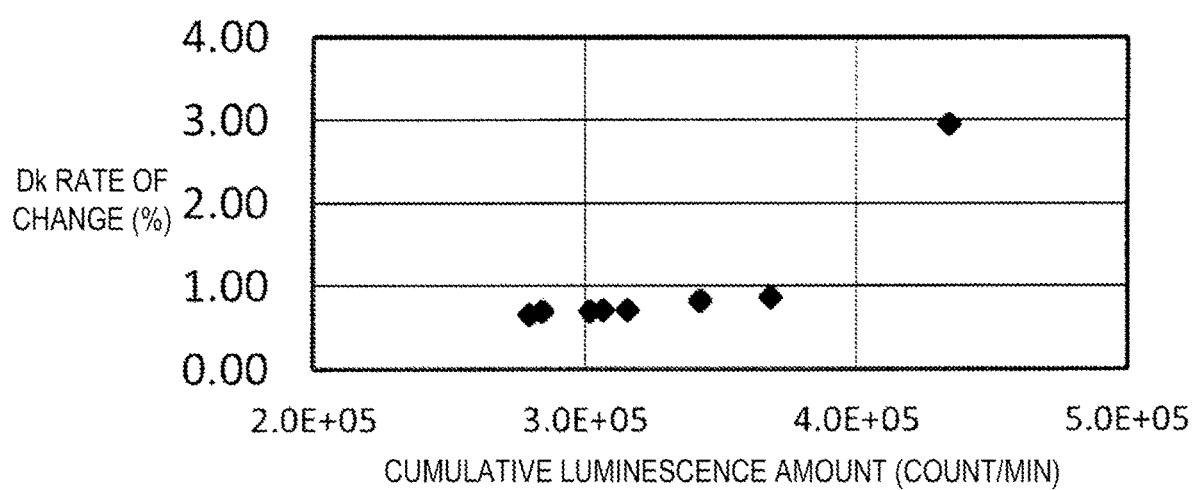

ORGANIC INSULATOR AND WIRING BOARD

TECHNICAL FIELD

The present disclosure relates to an organic insulator and a wiring board.

BACKGROUND OF INVENTION

In recent years, advancements such as an acceleration in LSI developments and increases in integration levels and memory capacity have been progressing, and in association therewith, decreases in the size, weight, and thickness of various electronic components have been rapidly advancing. Known wiring boards used in the field of such electronic components use, as insulating materials, cyclic olefin copolymers like those disclosed in Patent Document 1, for example. Such insulating materials are used, for example, as a wiring board for high frequency applications by adhering copper foil to a surface thereof.

CITATION LIST

Patent Literature

Patent Literature 1: JP 2010-100843 A

SUMMARY

An organic insulator of the present disclosure includes a cured resin product containing a cyclic olefin copolymer as a main component, and has a cumulative luminescence amount of $4 \times 10^5$ cpm or less measured by chemiluminescence measurement method.

A wiring board of the present disclosure includes an insulation layer including the organic insulator described above and an electrical conductor layer on a surface of the insulation layer.

BRIEF DESCRIPTION OF THE DRAWINGS

FIG. 1 is a graph in which a relationship between a cumulative luminescence amount and a Dk rate of change shown in Table 1 is plotted.

DESCRIPTION OF EMBODIMENTS

When a metal foil such as a copper foil is adhered to the surface of an organic insulator and the resulting product is used as a wiring board for high frequency applications, thermal resistance and stability over time of the dielectric characteristics are usually required. An organic insulator of the present disclosure includes a cured resin product containing a cyclic olefin copolymer as a main component. A cured product produced by curing the resin containing a cyclic olefin copolymer as a main component may be described hereinafter as simply a cured product. The cured product has a cumulative luminescence amount measured by chemiluminescence measurement method of $4 \times 10^5$ cpm or less.

Here, the unit "cpm" denotes a "count per minute" and corresponds to the number of photons generated per unit time (1 minute). Setting the cumulative luminescence amount to such a range makes it possible to reduce a rate of change over time of the dielectric characteristics of the cured product. For example, when the cured product is left standing in an environment at a temperature of 100° C. or higher for a long period of time, the rate of change in the dielectric loss tangent can be reduced. In this case, the stipulation of a temperature of 100° C. or higher means a temperature in a range of from 110° C. to 130° C.

Specifically, when the cured product is left standing at a high temperature in a constant temperature environment, the rate of change ($\Delta Dk$) of the relative permittivity (Dk) is 1% or less, and the rate of change ($\Delta Df$) of the dielectric loss tangent (Df) is 80% or less. The conditions for leaving standing at a high temperature at this time are, for example, a temperature of 125° C. and a standing time of 1000 hours.

The rate of change ($\Delta Dk$) of the relative permittivity (Dk) is calculated as follows. When the relative permittivity of the cured product before being left standing at a high temperature is denoted by Dk0, and the relative permittivity of the cured product after being left standing at the high temperature is denoted by Dk1, $$\Delta Dk\ (\%) = (Dk1 - Dk0) \times 100 / Dk0.$$

The rate of change ($\Delta Df$) of the dielectric loss tangent (Df) is calculated as follows. When the dielectric loss tangent of the cured product before being left standing at a high temperature is denoted by Df0, and the dielectric loss tangent of the cured product after being left standing at the high temperature is denoted by Df1. The absolute value of the calculated value is used for $\Delta Df$, $\Delta Df\ (\%) = (Df1 - Df0) \times 100 / Df0$.

The cured product is obtained by heating a raw resin composition, or in other words, an uncured resin composition, to thereby cure the resin composition. In this case, heating is also meant to include a step of pressurizing simultaneously with heating.

The cured product may include components besides the cyclic olefin copolymer. The components besides the cyclic olefin copolymer may be hereinafter referred to as additives. As a general guideline, the proportion of additives is preferably not greater than 40 vol %. From the above analysis, containing a cyclic olefin copolymer as a main component means that the proportion of a resin component derived from the cyclic olefin copolymer in the cured product of the resin is 60 vol % or greater. Examples of the additives include inorganic fillers such as silica and alumina, and flame retardants. The cured product may also contain a curing initiator and an antioxidant.

As for the proportion of additives, when a cross section of the organic insulator is analyzed using, for example, a scanning electron microscope equipped with an analyzer, a region having a predetermined surface area is selected at any location of the cross section. The proportion of additives is determined from a proportion obtained by totaling the surface area of the inorganic filler and flame retardant in the region. In this case, a portion obtained by excluding the surface area portion of the inorganic filler and flame retardant from the analyzed region is the region occupied by the cyclic olefin copolymer, which is the main component. Here, the determined surface area proportion may be expressed as a volume proportion.

When the cured product contains a curing initiator and an antioxidant, the curing initiator and antioxidant may be included in the resin containing the cyclic olefin copolymer as a main component. The cyclic olefin copolymer may include a peroxide having a benzene ring in the molecule. The cyclic olefin copolymer may include a monomer. A suitable example of the cyclic olefin copolymer is LCOC-5 available from Mitsui Chemicals, Inc.

When the cumulative luminescence amount determined by chemiluminescence measurement method of the cured product is $4\times10^5$ cpm or less, it can be considered to be a state in which oxidation of the cured product has not progressed much prior to implementing the chemiluminescence measurement method. In an embodiment of the present disclosure, It is conceivable that the cured product has an initial oxidation state like that presented below. In the following, initial oxidation may be referred to as primary oxidation. In this case, primary oxidation is oxidation that occurs when the raw (or uncured) resin containing the cyclic olefin copolymer as a main component is cured. it is conceivable that, after the raw resin containing a cyclic olefin copolymer as a main component is polymerized and a cured product is formed, a phenomenon in which a portion of the cured product is oxidized occurs when the cured product is removed from a pressurized heating device and exposed to air. Of the cured product, the portion that oxidizes is an unreacted portion of the cyclic olefin copolymer and/or a portion that has decomposed after polymerization.

The fabricated cured product has a storage elastic modulus determined by dynamic viscoelasticity measurement method of $8\times10^7$ Pa or higher. In this case, the storage elastic modulus is a value in a temperature range of 130° C. or lower.

The glass transition temperature of the cured product is preferably from 134° C. to 140° C. When the glass transition temperature of the cured product is from 134° C. to 140° C., the rate of change ($\Delta Dk$) of the relative permittivity (Dk) of the cured product can be kept to 0.83% or less. The rate of change ($\Delta Df$) of the dielectric loss tangent (Df) of the cured product can be kept to 72% or less.

The rate of change ($\Delta Dk$) of the relative permittivity (Dk) of the cured product and the rate of change ($\Delta Df$) of the dielectric loss tangent (Df) of the cured product can be minimized due to limitation for a state of primary oxidation exhibited by the cured product. An index indicating the state of primary oxidation exhibited by the cured product is the cumulative luminescence amount determined by chemiluminescence measurement method. In this case, the cumulative luminescence amount of the cured product is from $2.8\times10^5$ cpm to $3.2\times10^5$ cpm. When the cumulative luminescence amount of the cured product is from $2.8\times10^5$ cpm to $3.2\times10^5$ cpm, the rate of change ($\Delta Dk$) of the relative permittivity (Dk) of the cured product can be kept to 0.72% or less. The rate of change ($\Delta Df$) of the dielectric loss tangent (Df) of the cured product can be kept to 70% or less.

The organic insulator including the cured product is suitable for use in an insulation layer constituting the wiring board. A wiring board according to an embodiment of the present disclosure is equipped with an insulation layer and an electrical conductor layer disposed on a surface of the insulation layer. In this case, the insulation layer is preferably an organic insulator configured by the cured product described above. When the insulation layer configuring the wiring board is an organic insulator configured by the cured product described above, a wiring board having high reliability in conditions associated with being left at a high temperature for a long period of time can be obtained.

EXAMPLES

Hereinafter, embodiments of the present disclosure are specifically described through examples; however, the embodiments of the present disclosure are not limited to these examples. The components used in Examples 1 to 8 were as follows. A curing initiator (Percumyl D, available from NOF Corporation) and an antioxidant (Chimassorb 944, available from BASF SE) were added at proportions of 1 parts by mass and 0.3 parts by mass, respectively, to 100 parts by mass of a heat-resistant cyclic olefin copolymer (heat-resistant cyclic olefin copolymer (COC) (including a radically-polymerizable functional group), available from Mitsui Chemicals, Inc.). An amount of 40 mass % of the obtained mixture and 60 mass % of a solvent were mixed to obtain a resin varnish. A mixed solvent in which toluene and cyclohexane were mixed at a 1:1 mass ratio was used as the solvent.

Subsequently, the obtained resin varnish was molded into a sheet using a bar coater. The obtained sheet-shaped molded body was dried at 30° C. for 48 hours, then dried at 140° C. for 2 minutes, and an organic resin film having a thickness of 27 μm was obtained.

Then, the obtained organic resin film was cut into small pieces, and twelve of the small pieces were superimposed and laminated. A copper foil (surface roughness (Ra) of 1.7 μm) having a thickness of 18 μm was then laminated onto both sides of the obtained laminate, and an uncured copper-clad laminated sheet was produced.

Subsequently, the produced uncured copper-clad laminated sheet was subjected to a pressurizing and heating treatment under pressurization of 4 MPa at the temperature condition shown in Table 1, and a copper-clad laminated sheet having a thickness of approximately 0.3 mm was obtained. The conditions when implementing the pressurization and heating treatment are shown in Table 1 below. The curing temperature is described as the maximum temperature in Table 1. The time for which the uncured copper-clad laminated sheet was held at the maximum temperature is described as the holding time in Table 1.

A produced organic insulator was processed and then evaluated as follows. The sample used for the chemiluminescence measurement method was a portion of the organic insulator (cured product) obtained by cutting the copper-clad laminated sheet produced by carrying out the pressurizing and heating treatment. The sample was of a stage prior to introduction to a high temperature standing test (125° C., 1000 hours). The size of the sample was 40 mm×40 mm×0.3 mm. The chemiluminescence measurement method were implemented under the following conditions. The Multi- Luminescence-Spectrometer MLA-GOALS (available from Tohoku Electronic Industrial Co., Ltd.) was used as the measurement device. A method of measuring the change over time in the total luminescence amount was used as the measurement method. A thermal excitation method was adopted as the excitation method. The temperature at which the measurement was performed was set to 125° C. A stainless steel dish was used as the sample stand. Nitrogen gas was used for the atmosphere. The flow rate of the nitrogen gas was set to 50 mL/min. The measurement time of the chemiluminescence measurement method was 30 minutes. The number of measurement method was set to one for each sample. The value of the cumulative luminescence amount shown in Table 1 was expressed in exponential notation.

In the high temperature standing test, the temperature was set to 125° C. and the sample was left standing for 1000 hours.

Then, the copper foil was peeled from the obtained copper-clad laminated sheet, and the relative permittivity (Dk) and the dielectric loss tangent (Df) at room temperature (25° C.) and 79 GHz were measured by an equilibrium disc resonator method. The relative permittivity (Dk) and the dielectric loss tangent (Df) of each sample were measured before and after the sample was subjected to the high temperature standing test for 1000 hours. The number of measurement method was set to one for each sample.

In Table 1, measurement method obtained before the high temperature standing test was implemented are indicated by the column heading "Initial", and measurement method obtained after the high temperature standing test was implemented are indicated by the column heading "After 1000 hours at 125° C.". The rate of change (ΔDk) of the relative permittivity (Dk) was calculated as follows. When the relative permittivity of the cured product before being left standing at a high temperature is denoted by Dk0, and the relative permittivity of the cured product after being left standing at the high temperature is denoted by Dk1, $$\Delta Dk\ (\%) = (Dk1 - Dk0) \times 100 / Dk0.$$

The rate of change (ΔDf) of the dielectric loss tangent (Df) is calculated as follows. When the dielectric loss tangent of the cured product before being left standing at a high temperature is denoted by Df0, and the dielectric loss tangent of the cured product after being left standing at the high temperature is denoted by Df1, $$\Delta Df\ (\%) = (Df1 - Df0) \times 100 / Df0.$$

The absolute value of the calculated value is used for ΔDk, ΔDf.

The temperature at the loss tangent peak in data obtained through dynamic viscoelasticity measurement method was used as the glass transition temperature (Tg). The number of measurement method was set to one for each sample. The results are shown in Table 1. A graph in which the relationship between the cumulative luminescence amount and the Dk rate of change in Table 1 is plotted in FIG. 1.

TABLE 1

| | Pressurization and Heating Conditions | | | Cured Product Evaluation Results | | | | | |
|---|---|---|---|---|---|---|---|---|---|
| | | | | Cumulative Luminescence Amount in | Relative Permittivity Dk | | Dielectric Loss Tangent Df | | |
| Sample No. | Maximum Temperature (° C.) | Holding Time (Hr) | Tg (° C.) | Chemiluminescence Measurement method (count/min) | Initial | After 1000 hours at 125° C. | Initial | After 1000 hours at 125° C. | ΔDk (%) | ΔDf (%) |
| 1 | 180 | 2 | 142.0 | 3.7E+05 | 2.697 | 2.720 | 0.00164 | 0.00292 | 0.87 | 78.05 |
| 2 | 180 | 1.5 | 138.1 | 3.4E+05 | 2.700 | 2.722 | 0.00170 | 0.00292 | 0.83 | 71.76 |
| 3 | 180 | 1 | 138.3 | 2.8E+05 | 2.699 | 2.718 | 0.00172 | 0.00290 | 0.70 | 68.60 |
| 4 | 170 | 2 | 139.3 | 3.2E+05 | 2.698 | 2.717 | 0.00172 | 0.00290 | 0.72 | 68.60 |
| 5 | 160 | 2 | 137.5 | 3.1E+05 | 2.703 | 2.723 | 0.00170 | 0.00287 | 0.72 | 68.82 |
| 6 | 160 | 3 | 134.0 | 2.8E+05 | 2.700 | 2.718 | 0.00172 | 0.00291 | 0.65 | 69.19 |
| 7 | 180 | 2 | 139.3 | 3.0E+05 | 2.710 | 2.729 | 0.00190 | 0.00271 | 0.70 | 42.63 |
| 8 | 230 | 2 | 150.7 | 4.3E+05 | 2.710 | 2.790 | 0.00168 | 0.00644 | 2.95 | 283.33 |

As is clear from Table 1 and FIG. 1, the samples (Sample Nos. 1 to 7) for which the cumulative luminescence amount measured by chemiluminescence measurement method was $4 \times 10^5$ cpm or less had a rate of change (ΔDk) in relative permittivity (Dk) of 0.87% or less and a rate of change (ΔDf) in the dielectric loss tangent (Df) of 78.05% or less. All of these samples had a curing temperature of 180° C. or lower.

In contrast, Sample No. 8, which had a curing temperature of 230° C., had a cumulative luminescence amount determined by chemiluminescence measurement method of $4.3 \times 10^5$ cpm. The rate of change (ΔDk) in relative permittivity (Dk) was 2.95%, and the rate of change (ΔDf) in the dielectric loss tangent (Df) was 283.33%.

The samples (Sample Nos. 2 to 7) having a glass transition temperature (Tg) of from 134° C. to 140° C. had a rate of change (ΔDk) in relative permittivity (Dk) of 0.83% or less and a rate of change (ΔDf) in the dielectric loss tangent (Df) of 71.76% or less.

The samples (Sample Nos. 3 to 7) having a cumulative luminescence amount of from $2.8 \times 10^5$ cpm to $3.2 \times 10^5$ cpm had a rate of change (ΔDk) in relative permittivity (Dk) of 0.72% or less and a rate of change (ΔDf) in the dielectric loss tangent (Df) of 69.19% or less.

The invention claimed is:

1. An organic insulator comprising a cured resin product:
   containing a cyclic olefin copolymer as a main component; and having a cumulative luminescence amount of $3.7 \times 10^5$ cpm or less measured by chemiluminescence measurement method.

2. The organic insulator according to claim 1, wherein the cured resin product has a glass transition temperature of 134° C. to 140° C.

3. The organic insulator according to claim 1, wherein the cumulative luminescence amount is from $2.8 \times 10^5$ cpm to $3.2 \times 10^5$ cpm.

4. A wiring board comprising:
an insulation layer comprising the organic insulator according to claim 1; and
an electrical conductor layer on a surface of the insulation layer.

* * * * *